United States Patent
Lim et al.

(10) Patent No.: US 8,685,494 B2
(45) Date of Patent: Apr. 1, 2014

(54) ALD METHOD OF FORMING THIN FILM COMPRISING A METAL

(75) Inventors: Jae-Soon Lim, Seoul (KR); Jae-Hyoung Choi, Hwaseong-si (KR); Youn-Soo Kim, Yongin-si (KR); Min-Young Park, Seoul (KR); Sang-Yeol Kang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 209 days.

(21) Appl. No.: 13/242,037

(22) Filed: Sep. 23, 2011

(65) Prior Publication Data

US 2012/0094022 A1   Apr. 19, 2012

(30) Foreign Application Priority Data

Oct. 19, 2010   (KR) .................. 10-2010-0102105

(51) Int. Cl.
  *C23C 16/00*   (2006.01)
(52) U.S. Cl.
  USPC .................................. 427/248.1; 427/255.23
(58) Field of Classification Search
  USPC .............. 427/248.1, 255.23; 117/84, 88
  See application file for complete search history.

(56) References Cited

U.S. PATENT DOCUMENTS

| | | | | |
|---|---|---|---|---|
| 6,576,053 | B1 * | 6/2003 | Kim et al. | 117/89 |
| 2003/0168001 | A1 * | 9/2003 | Sneh | 117/86 |
| 2004/0071878 | A1 * | 4/2004 | Schuhmacher et al. | 427/255.28 |
| 2005/0020066 | A1 * | 1/2005 | Choi et al. | 438/683 |
| 2007/0128858 | A1 * | 6/2007 | Haukka et al. | 438/656 |
| 2008/0272421 | A1 | 11/2008 | Bhat | |

FOREIGN PATENT DOCUMENTS

| KR | 1020040091354 A | 10/2004 |
|---|---|---|
| KR | 1020060078397 A | 7/2006 |

OTHER PUBLICATIONS

Lim, Booyong S., et al., "Atomic layer deposition of transition metals." Nature Materials, vol. 2, Nov. 2003, pp. 749-754.*

Baumann, Theodore F., et al., "Atomic Layer Deposition of Uniform Metal Coatings on Highly Porous Aerogel Substrates". Chemical Materials 2006, 18, 6106-6108.*

Kim, H., "Atomic layer deposition of metal and nitride thin films: Current research efforts and applications for semiconductor device processing". J. Vac. Sci. Technol. B 21(6), Nov./Dec. 2003, pp. 2231-2261.*

* cited by examiner

*Primary Examiner* — Bret Chen
(74) *Attorney, Agent, or Firm* — Volentine & Whitt, PLLC

(57) ABSTRACT

A method of forming a metal thin film can reduce leakage current while improving electric properties by improving step coverage of a device. The method of forming a metal thin film includes supplying a metal precursor including chlorine, purging byproducts produced after the supplying of the metal precursor by injecting a purge gas, supplying a reactant to allow the reactant and the metal precursor to react with each other to form a thin film layer, and purging the byproducts produced after the reaction by injecting a purge gas, wherein before the supplying of the metal precursor, the method further includes supplying a reactant to be adsorbed on a treated product.

15 Claims, 8 Drawing Sheets

ALD METHOD OF FORMING THIN FILM COMPRISING A METAL

CROSS-REFERENCE TO RELATED APPLICATION(S)

This application claims priority from Korean Patent Application No. 10-2010-0102105 filed on Oct. 19, 2010 in the Korean Intellectual Property Office, and all the benefits accruing therefrom under 35 U.S.C. 119.

BACKGROUND

The inventive concept relates to a method of forming a metal thin film for use in a process of fabricating semiconductor devices and the like.

Physical vapor deposition (PVD), such as sputtering, has conventionally been used to precisely form metal thin films of semiconductor devices and the like. However, metal thin films formed by PVD have poor step coverage. Thus, PVD can not be implemented to meet the recent trend in semiconductor technology toward ultrahigh integration and ultrathin film formation. On the other hand, chemical vapor deposition (CVD) has been considered as a technique for forming metal thin films because films formed by CVD exhibit a high degree of uniformity and excellent step coverage. However, it is difficult to use CVD to form a film having a desired composition ratio and CVD is a process that must be performed at high temperatures. Accordingly, films formed by CVD may adversely affect the electrical properties or lower the capacitance of the resulting device.

To overcome these shortcomings, an atomic layer deposition (ALD) process, in which processing gases are independently supplied, has been developed. However, a dielectric film may be damaged by the chloride used as a metal source gas in the ALD process. In this case, leakage current is increased.

SUMMARY

According to one aspect of the inventive concept, there is provided an atomic layer deposition (ALD) method of forming a metal thin film which first forms a thin layer, e.g., a mono-layer, of a reactant as an adsorbate to protect the product on which the metal thin film is formed. The product is loaded into a processing chamber. Then an adsorbate, comprising a reactant capable of reacting with a metal precursor of the thin film, is supplied into the processing chamber. After an amount of the adsorbate has been adsorbed at the surface of the product, a metal precursor of the thin film is supplied into the processing chamber in such an amount that some of the metal precursor is adsorbed and remains non-reacted at the surface of the product. Next, a purging process is performed by introducing a purge gas into the processing chamber. The purging process may remove non-reacted products that are adsorbed at the surface of the product as well as byproducts of a reaction between the metal precursor and the reactant. Subsequently, a main reaction of the ALD process is facilitated using the non-reacted metal precursor adsorbed at the surface of the product. Specifically, more of the reactant is supplied into the processing chamber and the resulting reaction between the reactant and the metal precursor forms a metal film on the surface of the product. Then another purging process is performed by introducing a purge gas into the processing chamber.

According to another aspect of the inventive concept, there is provided another atomic layer deposition (ALD) method of forming a metal thin film on a product, and in which an adsorbate of a reactant of the ALD process is first formed at the surface of the product. The product is supplied with a metal precursor including chlorine. Subsequently, a purging process is performed by injecting a purge gas into the ambient around the product. Then the product is supplied with a reactant that reacts with the metal precursor to form a metal film on a surface of the product. Another purging process is then performed by injecting a purge gas into the ambient around the product on which the metal film has been formed. However, before the metal precursor is supplied, the surface of the product is exposed to an amount of the reactant in such a way that the reactant is adsorbed at the surface of the product.

According to another aspect of the inventive concept, there is provided an atomic layer deposition (ALD) method of forming a metal thin film which first forms an adduct of process gases of the ALD process as an adsorbent at the surface of the product to protect the product on which the metal thin film is formed. The product is then supplied with a metal precursor that includes a metal and chlorine. Next, a purging process is performed by injecting a purge gas into the ambient around the product. Then the product is supplied with the reactant. In a main reaction of the ALD process, the reactant reacts with the metal precursor to form a metal film on a surface of the product. Another purging process is performed by injecting a purge gas into the ambient around the product on which the metal film has been formed. In this case, however, an adduct of the metal precursor and the reactant is formed as an adsorbate at the surface of the product before the product is supplied with the metal precursor used in the main reaction.

BRIEF DESCRIPTION OF THE DRAWINGS

The above and other features and advantages of the inventive concept will become more apparent from the following detailed description of preferred embodiments thereof, made with reference to the attached drawings in which.

DETAILED DESCRIPTION OF THE EMBODIMENTS

Figure 1:
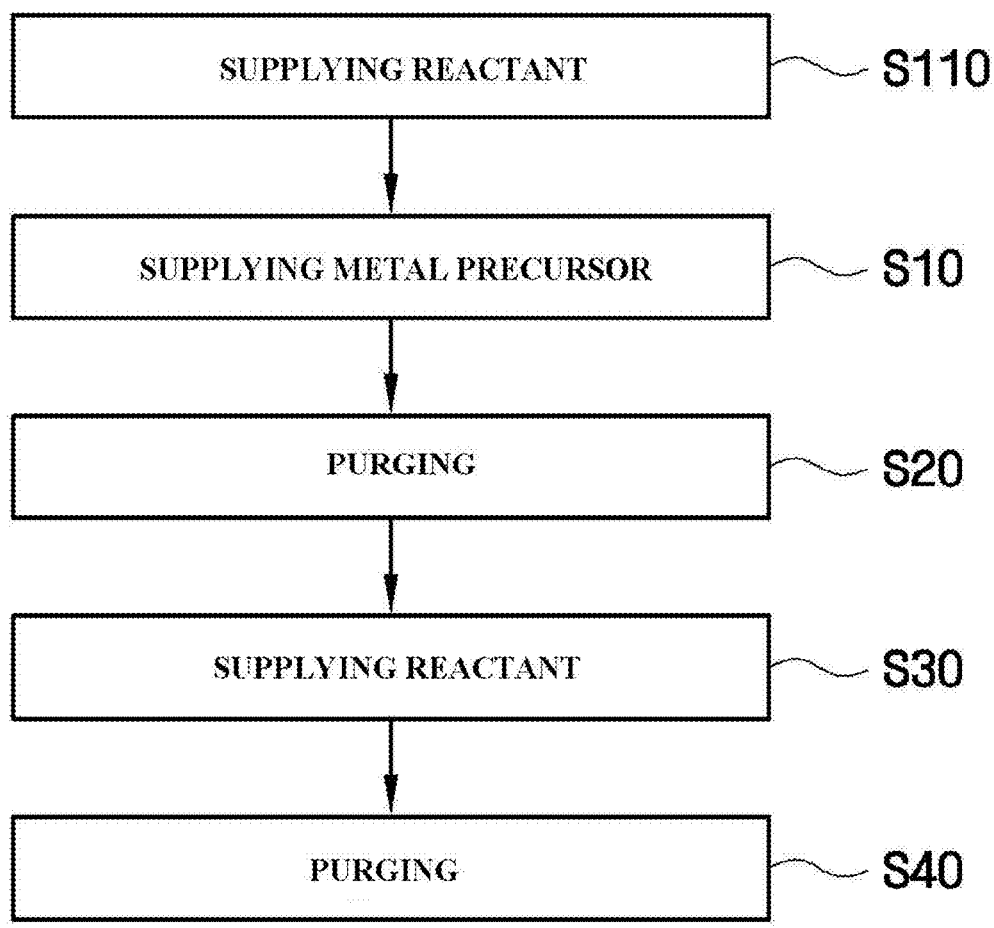
FIG. 1 is a flowchart of an embodiment of a method of forming a metal thin film according to the inventive concept.

Various embodiments and examples of embodiments of the inventive concept will now be described more fully hereinafter with reference to the accompanying drawings. However, terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes.

A first embodiment of a method of forming a metal thin film according to the inventive concept will now be described in general with reference to FIG. 1.

The method of forming a metal thin film on a product includes, in general, steps of supplying a reactant (S110), supplying a metal precursor (S10), purging (S20), supplying a reactant (S30), and purging (S40). The product comprises a substrate. The inventive concept may be applied to form a lower electrode or an upper electrode of a semiconductor device. In the latter case, a dielectric film is previously formed on the substrate. The dielectric film may be of a high-k dielectric such as $HfO_2$, $Al_2O_3$, $TiO_2$, or $ZrO_2$.

In the step (S110), an adsorbate of reactant is fed through a supply line to a processing device, such as a processing chamber, containing product. The reactant is supplied at a rate of 100 to 2000 $cm^3/s$, for example, which is high enough to allow the reactant to saturate the surface of the product. Furthermore, at this time, an inactive carrier gas such as hydrogen ($H_2$), helium (He), nitrogen ($N_2$), neon (Ne), argon (Ar), krypton (Kr) or Xenon (Xe) may be injected into the processing device together with the reactant to facilitate the supplying of the reactant. As a result of this process, the reactant is irreversibly adsorbed at the surface of the product to thereby form a first thin layer, specifically, a mono-layer (a layer that is one atom or molecule thick), on the product. Although not shown, a purge gas may be supplied into the processing device after at least the mono-layer has been formed to remove any reactant remaining in the processing device.

The metal precursor is a compound serving as the source of metal for the film to be formed. In examples of the present embodiment, metal chloride is used as the metal precursor. The metal chloride may be a compound of $M_aCl_b$ where M represents a metal, and reference characters a and b denote integers. The metal M may include at least one metal selected from the group consisting of aluminum (Al), silicon (Si), titanium (Ti), cobalt (Co), gallium (Ga), germanium (Ge), strontium (Sr), yttrium (Y), zirconium (Zr), niobium (Nb), rhtenium (Ru), indium (In), barium (Ba), lanthanum (La), hafnium (Hf), tantalum (Ta), tungsten (W), iridium (Ir), lead (Pb), and bismuth (Bi).

In any case, however, a metal chloride may react with the product in such a way as to etch the same. In this case, portions of the product are physically and/or chemically degraded which, in turn, undermines the characteristics of the thin film to be formed. Poor thin film characteristics, as explained above, lead to increased leakage current. In the present embodiment, however, the reactant is supplied before the metal chloride precursor is supplied. Therefore, the reactant is adsorbed at the surface of the product to prevent the metal precursor from contacting and hence, from etching, the product. Accordingly, the thin film formed according to the inventive concept has excellent characteristics.

A substance capable of reacting with the metal precursor may be used as the reactant. The reactant may include nitrogen and/or oxygen. More specifically, the reactant may include at least one gas selected from the group consisting of nitric oxide, ammonia, $N_2$, $N_2$ plasma, hydroperoxide and alcohol. Basically, the reactant will depend on the metal precursor used.

In the purging step (S20), at least byproducts of the reaction between the reactant and the metal precursor are removed from around the product by injecting a purge gas into the processing device. The purge gas may be an inert gas, such as $N_2$, Ar, or He.

In the step (S30) of supplying reactant, additional reactant is supplied into the processing device to react with the metal precursor supplied in step S10, to thereby form a metal thin film. In this process, the reactant may be supplied together with a carrier gas for facilitating the supplying of the reactant into the processing device.

In the purging step (S40), purge gas is again injected into the processing device to remove unreacted products or byproducts produced by the reaction between the metal precursor and the reactant supplied in step S30.

The method will now be described in more detail with reference to FIGS. 1 and 2

Figure 2:
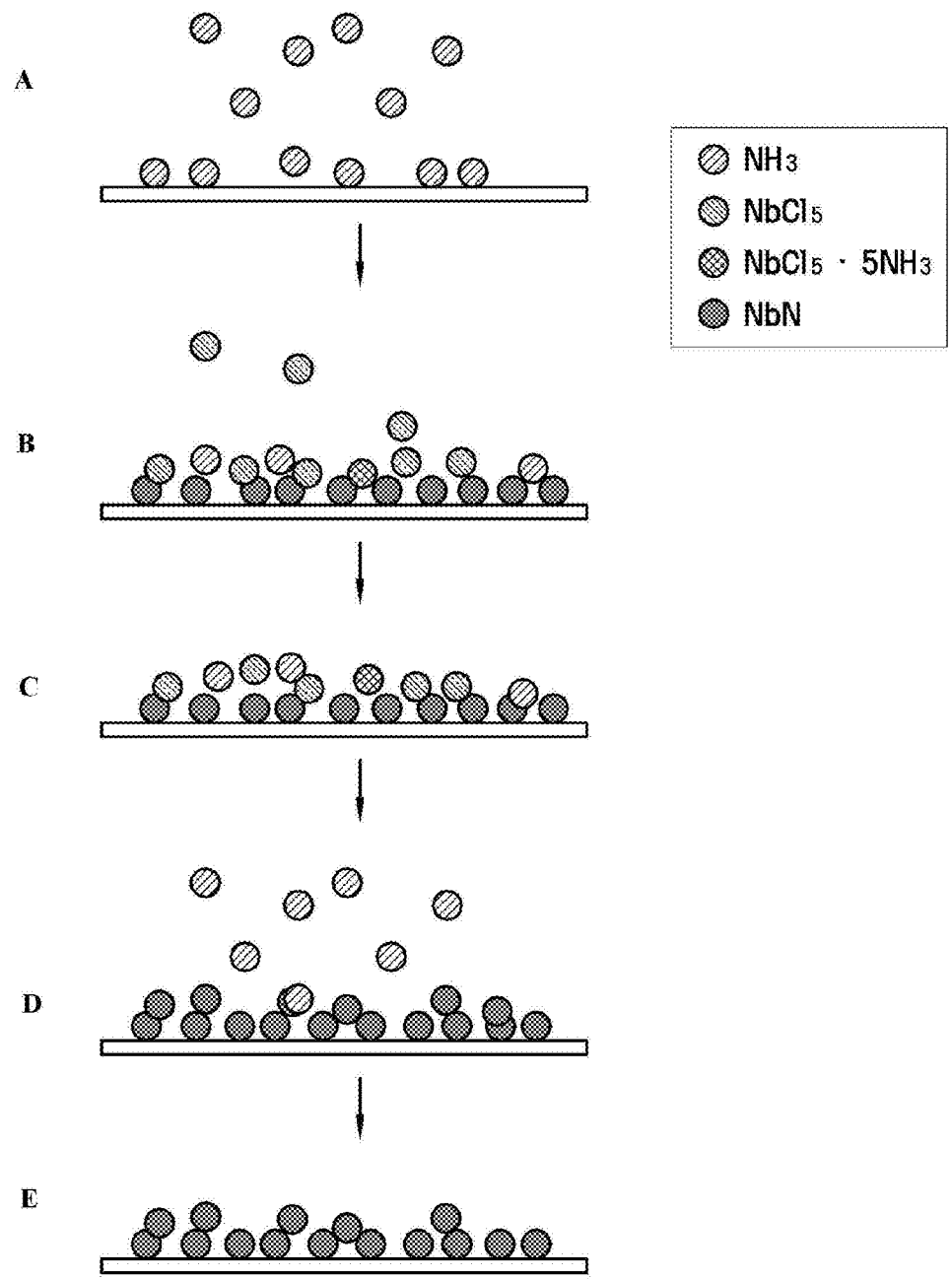
FIG. 2 is a schematic diagram illustrating a sequence of process steps of the method of forming a metal thin film illustrated in FIG. 1.

In FIG. 2, illustration A shows the reactant (supplied in step S110) being adsorbed at a surface of the product before the metal precursor is supplied (in step S10). Note, FIG. 2 illustrates an example of the method in which the reactant is $NH_3$.

Illustration B shows the supplying a metal precursor including chlorine (S10). In the specific example shown in FIG. 2, the metal precursor is $NbCl_5$. At this time, the metal chloride and the reactant react with each other to form a mono-layer of NbN, while unreacted metal precursor exists in a state in which it is adsorbed at the first thin film layer.

Illustration C shows the purging (S20) of both unreacted products that are physically but not chemically adsorbed, and of byproducts of the reaction.

Illustration D shows additional reactant being supplied (S30), and a thin film layer of NbN formed on the product as a result. In this stage, the reactant is supplied to react with metal precursor which was supplied in the earlier step S10 and was adsorbed on the first thin film layer after the reaction between the metal precursor and the adsorbed reactant had been completed. In this example, the NbN layer has a work function in a range of between 4.7 and 4.9 eV. Accordingly, the NbN layer only allows for a small amount of leakage current and as such, is well suited for us as an upper or lower electrode of a capacitor.

Illustration E in FIG. 2 shows the purging (S40) of unreacted products and byproducts of the reaction that took place in the previous step (step S30). In this stage, substances that have not been chemically adsorbed at the surface of the product are all removed.

The steps S110, S10, S20, S30 and S40 may be repeated several to several hundred times until a metal thin film of a desired thickness is obtained. In this way, i.e., by stacking metal thin films that are each an atomic-layer thick, a thin film having a uniform thickness and excellent step coverage can be obtained. In addition, the steps S110, S10, S20, S30 and S40 may be performed at a temperature in a range of 300 to 600° C. The processing gases, such as the metal precursor, will not deteriorate within this temperature range. In addition, deposition is facilitated because the processing gases are not condensed in this temperature range.

Another embodiment of a method of forming a metal thin film will now be described with reference to FIGS. 3 and 4.

This embodiment includes steps of supplying a reactant and a metal precursor (S120), purging (S121), supplying a reactant (S122), supplying a metal precursor (S10), purging (S20), supplying a reactant (S30), and purging (S40). Steps S10, S20, S30 and S40 are similar to those shown in and described above with reference to FIGS. 1 and 2. Therefore, these steps will not be described in detail.

Figure 3:
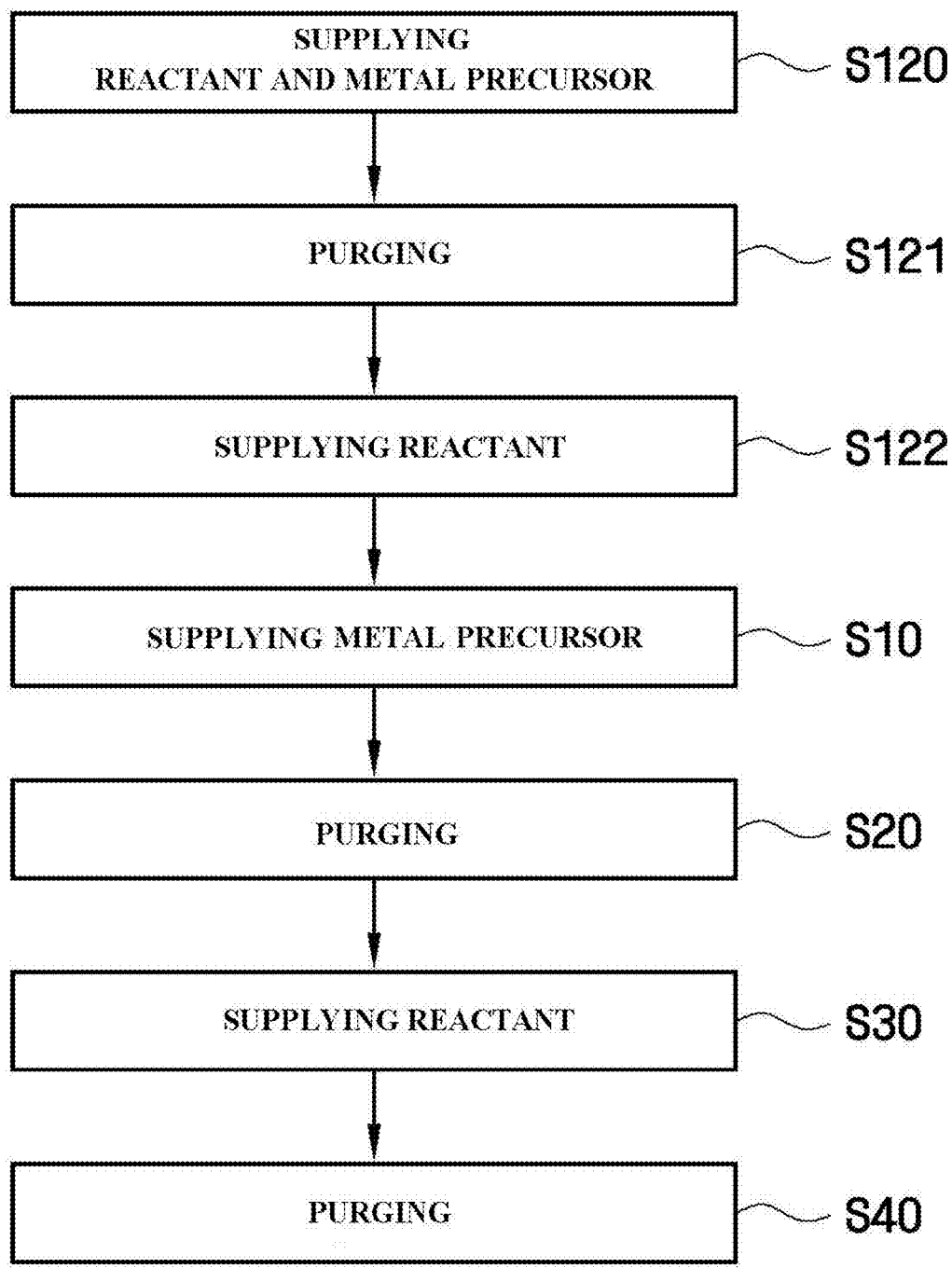
FIG. 3 is a flowchart of another embodiment of a method of forming a metal thin film according to the inventive concept.
Figure 4:
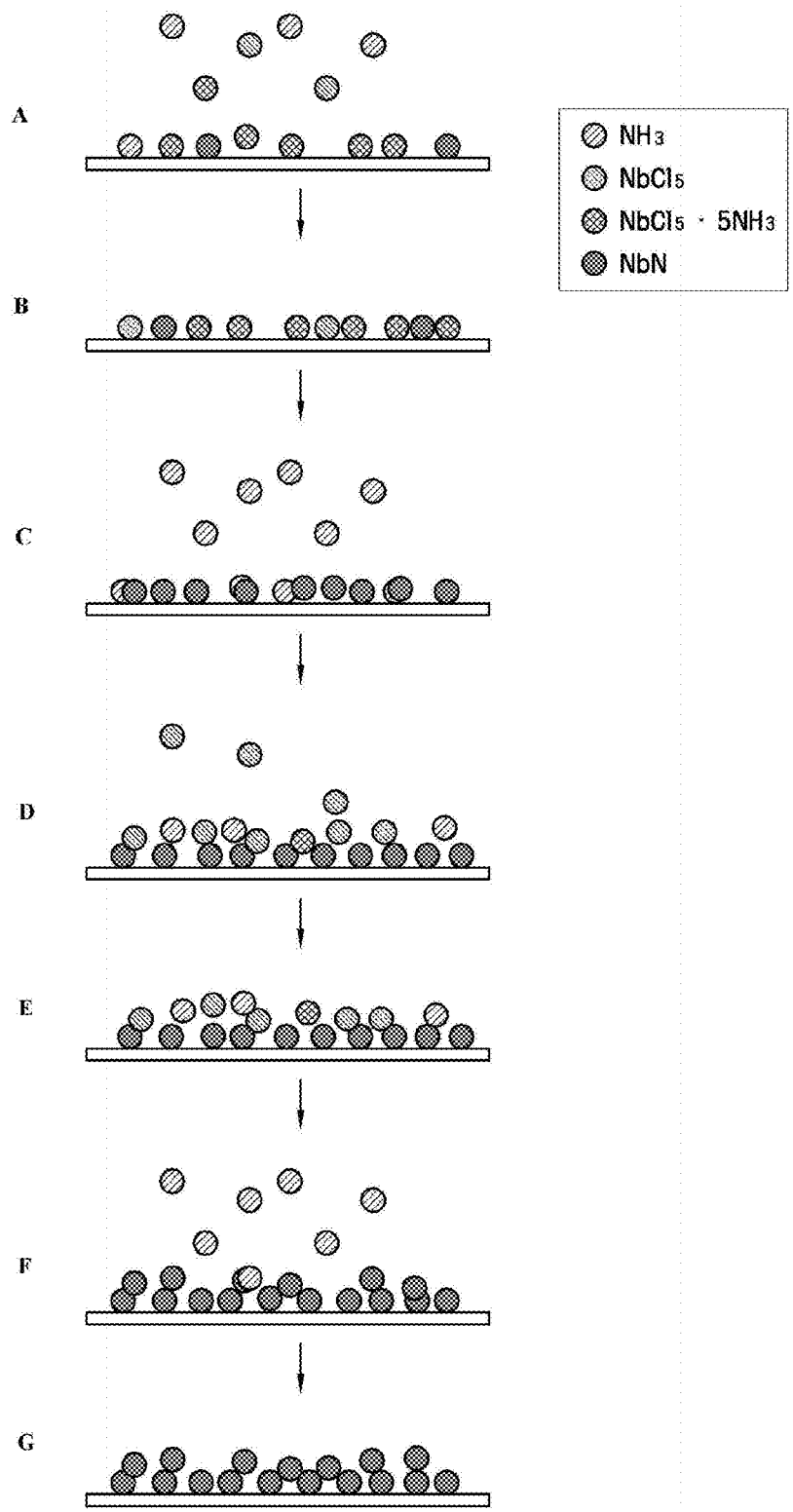
FIG. 4 is a schematic diagram illustrating a sequence of process steps of the method of forming a metal thin film illustrated in FIG. 3.

Referring to FIG. 3 an illustration A FIG. 4, in the step (S120), the reactant and metal precursor including chlorine are simultaneously supplied so as to be adsorbed at a surface of the product. In this stage, some of the reactant and the metal precursor are combined with each other in the form of an adduct as an adsorbate which will be chemically adsorbed at the surface of the product. The adduct in this example is $NbCl_5 \cdot 5NH_3$. On the other hand, some of $NbCl_5$ and $NH_3$ react with each other to form NbN at the surface of the product. The relative amount of the adduct formed varies according to the temperature at which $NbCl_5$ and $NH_3$ are supplied. More specifically, at a temperature lower than or equal to 350° C., most of the $NbCl_5$ and $NH_3$ combine to form the adduct. On the other hand, the adduct or an NbN thin film is formed at a temperature between 350° C. and 600° C.

Referring to FIG. 3 and illustration B in FIG. 4, in the purging step (S121), a purge gas is injected to purge the processing device of substances that are not chemically adsorbed at the surface of the product. As a result, only a chemically adsorbed mono-layer exists on the product. Note, however, that this purging step (S121) is optional, i.e., may be omitted under some circumstances.

Referring to FIG. 3 and illustration C in FIG. 4, in step (S122), the reactant is supplied to react with the metal precursor that is chemically adsorbed at the surface of the product, thereby forming a first thin film layer. That is, in this stage, the mono-layer is converted into a first thin film layer, while unreacted reactants exist in a state in which they are adsorbed at the first thin film layer. As is clear from the description above, this thin film layer prevents the metal precursor supplied in the next step (S10) from directly contacting the product and thus, prevents the product from being etched. Illustrations D, E, F and G in FIG. 4 illustrate steps S10, S20, S30 and S40, respectively.

The steps S120, S121, S122, S10, S20, S30 and S40 may be repeatedly performed several to several hundred times until a metal thin film of a desired thickness is obtained.

Another embodiment of a method of forming a metal thin film according to the inventive concept will now be described with reference to FIGS. 5 and 6.

Figure 5:
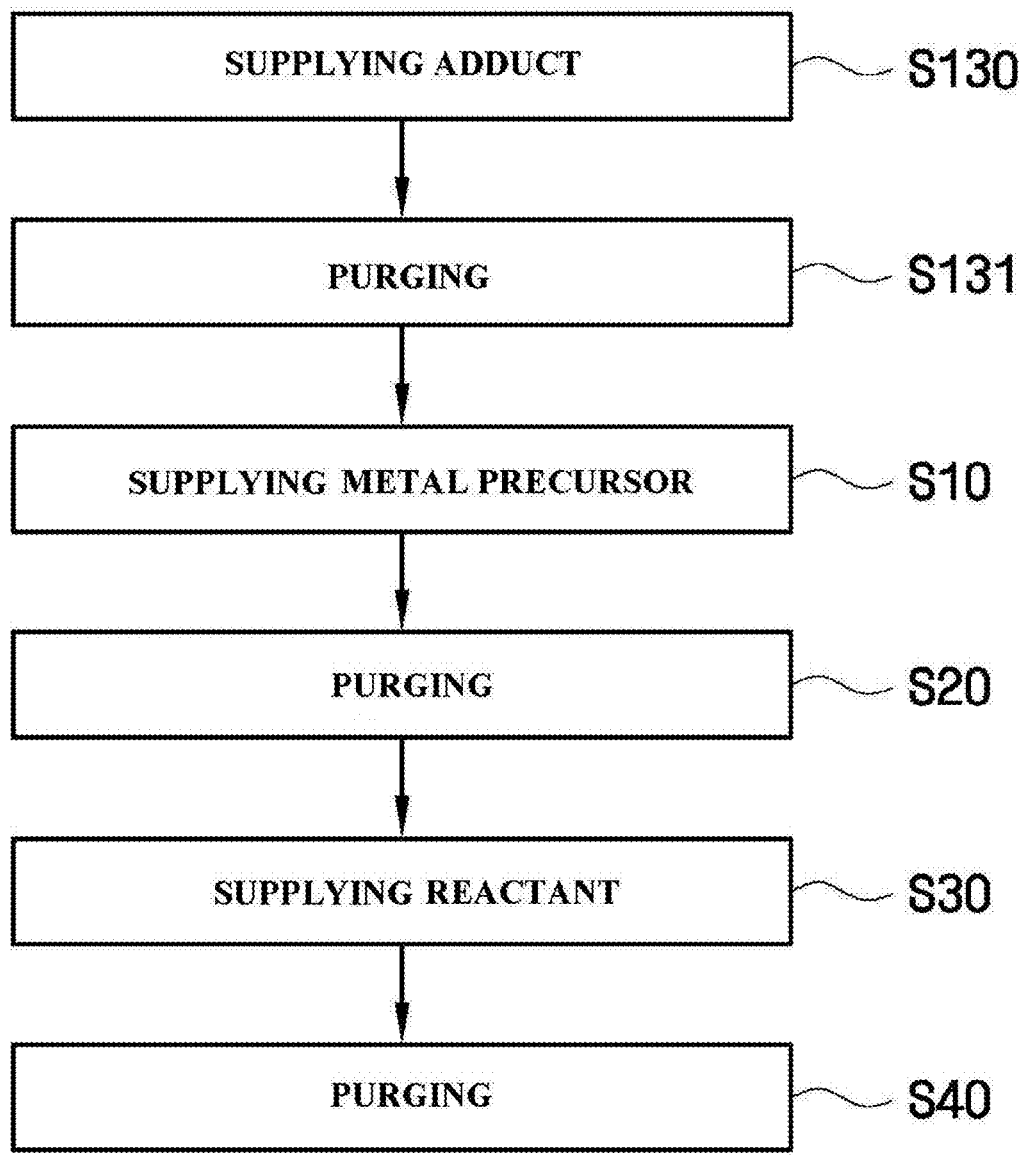
FIG. 5 is a flowchart of still another embodiment of a method of forming a metal thin film according to the inventive concept.

Referring to FIG. 5, this embodiment of a method of forming a metal thin film includes steps of supplying an adduct (S130), purging (S131), supplying a metal precursor (S10), purging (S20), supplying a reactant (S30), and purging (S40).

Figure 6:
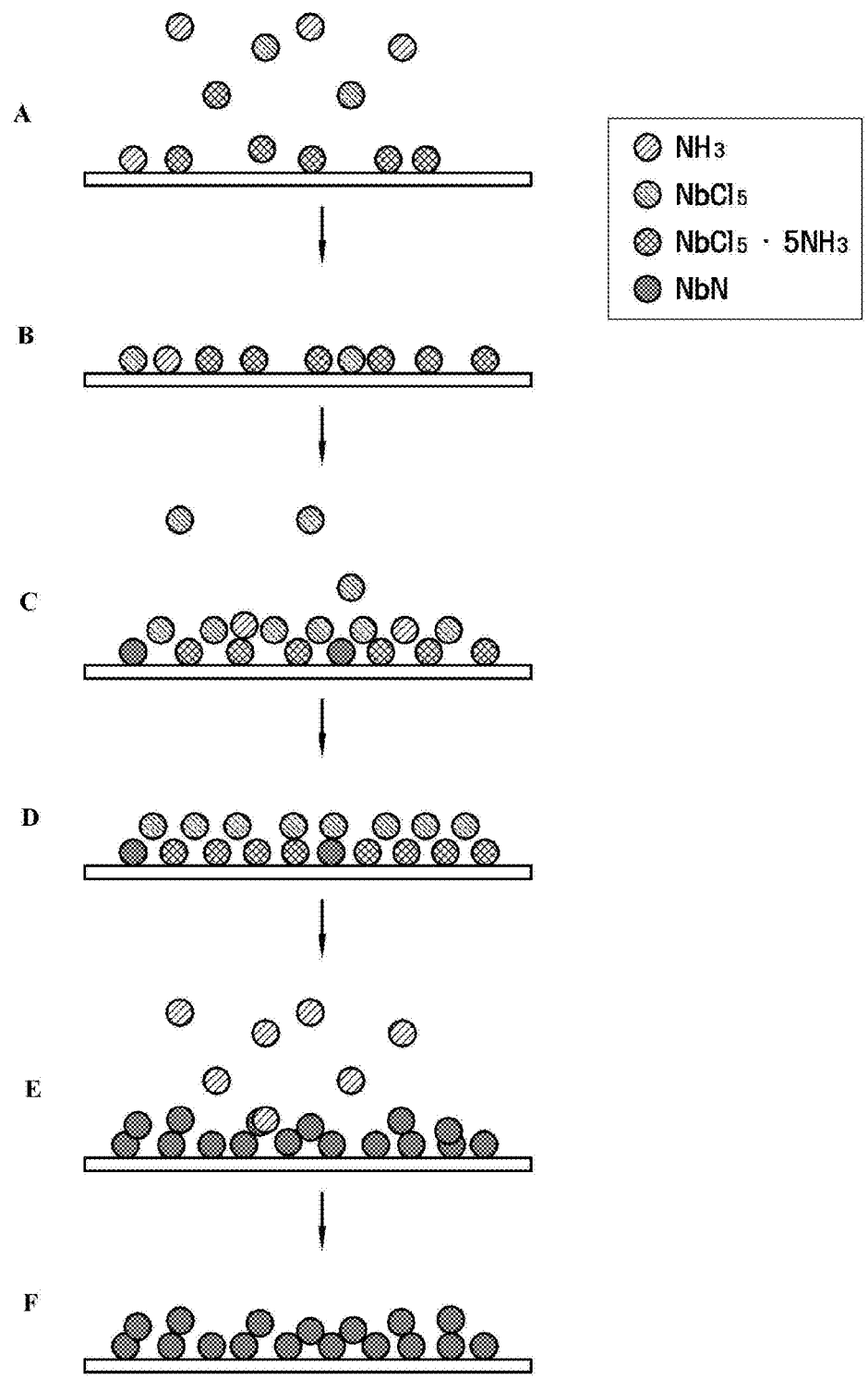
FIG. 6 is a schematic diagram illustrating a sequence of process steps of the method of forming a metal thin film illustrated in FIG. 5.

More specifically, with reference to FIG. 5 and illustration A in FIG. 6, an adduct is supplied (S130) into a processing device (e.g., a processing chamber) containing a product (substrate). As a result, the adduct is adsorbed at a surface of the product. The adduct is a product of a metal precursor including chlorine and a reactant. In this example, the adduct is $NbCl_5 \cdot NH_3$.

Referring to FIG. 5 and illustration B in FIG. 6, substances that are not adsorbed by the product are removed by injecting a purge gas (S131) into the processing device. The purging step (S131), however, is optional. That is, as mentioned in connection with the previous embodiment, the purging step may be omitted in some circumstances.

In any case, at this stage of the process, a mono-layer of the chemically-adsorbed adduct exists on the surface of the product.

Referring to FIG. 5 and illustration C in FIG. 6, a metal precursor including chlorine is supplied (S10) into the processing device. As a result, the metal precursor is chemically adsorbed at the mono-layer. Here, the metal precursor exists in a state in which it is adsorbed on the adduct without reacting with the adduct.

Referring to FIG. 5 and illustration D in FIG. 6, substances that are not chemically adsorbed at the surface of the product are removed by injecting a purge gas (S20) into the processing device. At this stage of the process, therefore, the adduct that is adsorbed at the surface of the product and a layer of the metal precursor is chemically adsorbed at the surface of the adduct.

Referring to FIG. 5 and illustration E in FIG. 6, more of the reactant is supplied (S30) is supplied into the processing device. There, the reactant reacts with the metal precursor and the exposed adduct. As a result, a metal thin film layer is formed.

The purge step S40 (illustration F in FIG. 6) is similar to that shown in and described with reference to FIG. 1 and illustration E in FIG. 2. Therefore, this step (S40) will not be described in further detail.

The steps S130, S131, S10, S20, S30 and S40 may be repeated several to several hundred times until a metal thin film of a desired thickness is obtained.

Specific experimental examples of the inventive concept will now be described. These examples that follow are provided only for illustrative purposes only.

EXPERIMENT 1

Measurement of Leakage Current

Figure 7:
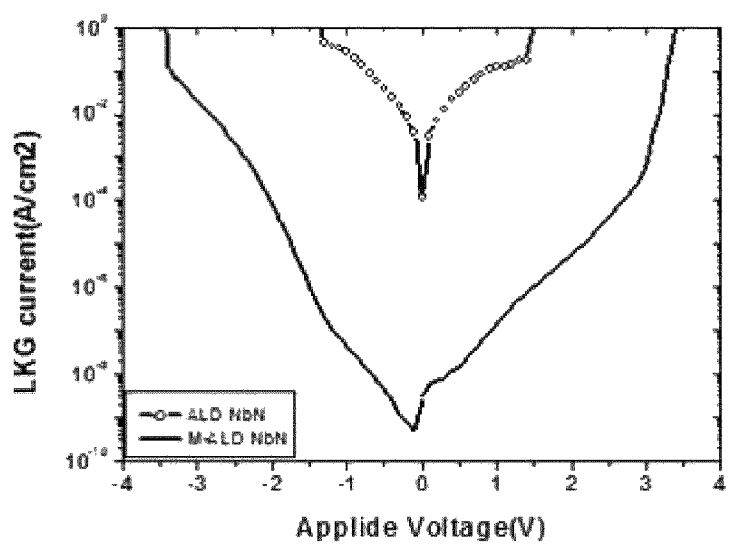
FIG. 7 is a graph illustrating leakage current in a metal thin film according to an example of the inventive concept and according to a comparative example.

FIG. 7 illustrates leakage current measured in an Example of a metal thin film formed according to the inventive concept and in a Comparative Example. In the Example (M-ALD NbN in the figure), an NbN metal thin film was formed on a $ZrO_2$ dielectric film using the process shown in and described with reference to FIGS. 1 and 2, wherein reactant gas of $NH_3$ was supplied before any of the $NbCl_5$ precursor was. On the other hand, in the Comparative Example (ALD NbN in the figure), an NbN metal thin film was formed on a $ZrO_2$ dielectric film by essentially the same process but without the step (S110) of supplying reactant gas prior to supplying any of the $NbCl_5$ precursor.

As shown in FIG. 7, an NbN metal thin film formed using the process shown in and described with reference to FIGS. 1 and 2 exhibits better leakage current characteristics compared to an NbN metal thin film formed by a similar process that omits the step supplying the reactant before the metal precursor.

EXPERIMENT 2

Measurement of Leakage Current according to Supply Time of Metal Precursor

Figure 8:
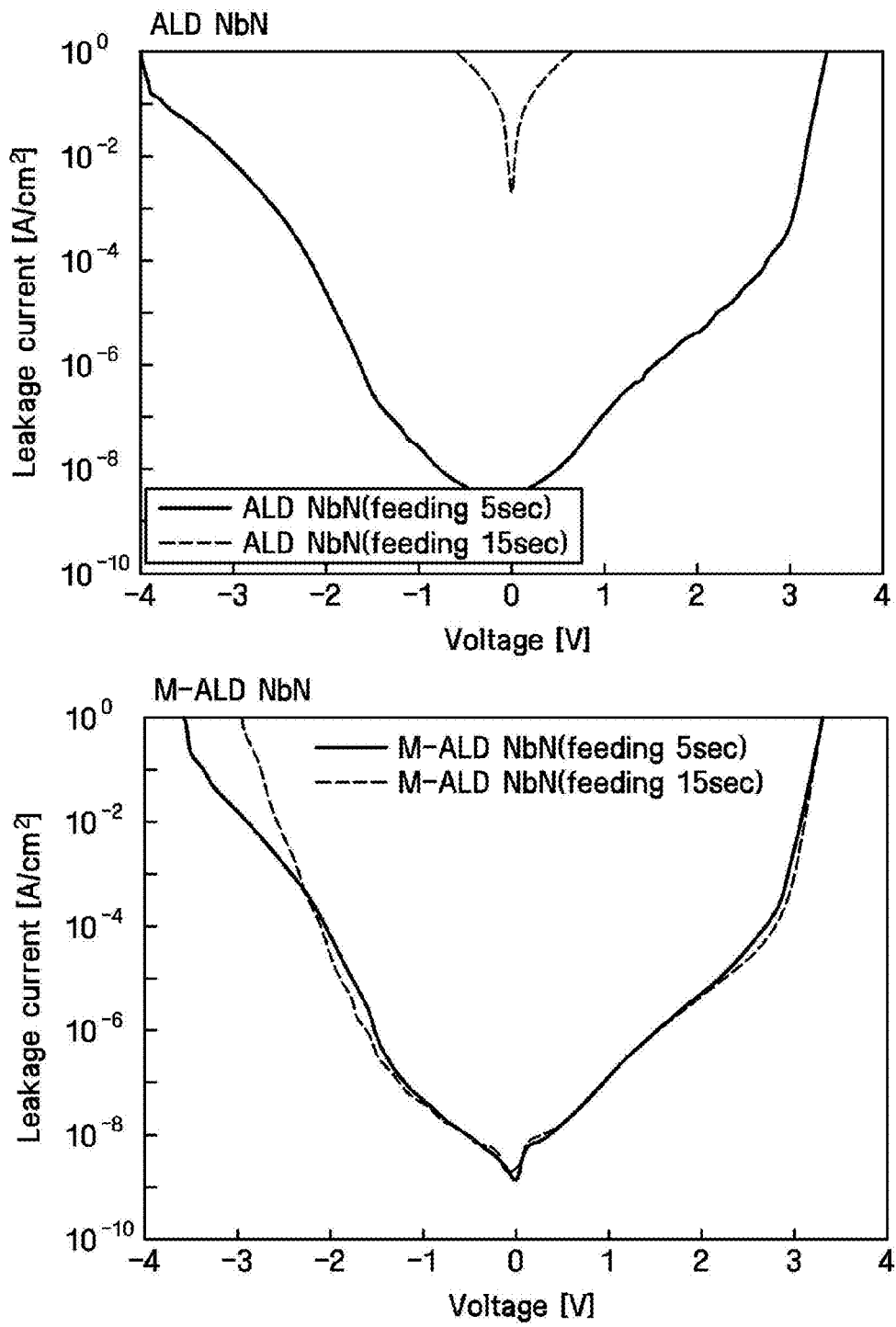
FIG. 8 is set of graphs illustrating leakage current in Examples of metal thin films formed according to the inventive concept, wherein the time over which metal precursor was supplied varied, and in Comparative Examples.

FIG. 8 illustrates leakage current in Examples of the metal thin film according to the inventive concept (M-ALD NbN in the lower graph of the figure) and in Comparative Examples (ALD NbN in the upper graph in the figure). The Examples and Comparative examples were formed as described above but using different durations (5 sec and 15 sec) for the time that the $NbCl_5$ precursor was supplied.

As shown in FIG. 8, with respect to the Examples of the NbN metal thin film formed according to the inventive concept, the leakage current was not greater for the case in which the $NbCl_5$ was supplied for a longer period of time (for 15 sec compared to 5 sec). Therefore, this shows that the method of forming a metal thin film according to the inventive concept is well-suited for use in forming a three-dimensional structure requiring a large amount of metal precursor. On the other hand, with respect to the Comparative Examples, the leakage current was much greater for the case in which the NbCl$_5$ precursor was supplied for the longer period of time (for 15 sec compared to 5 sec). As these results make clear, the dielectric film was etched by the reaction between the dielectric film and the metal precursor, the extent to which the dielectric film was etched increased with the increase in the supply of the metal precursor containing chlorine, and the increase in leakage current was due to the greater extent to which the dielectric film was etched in the case in which the supply time for the metal precursor was longer.

EXPERIMENT 3

Evaluation of Step Coverage

Step coverage can be calculated from the following Equation:

$$\text{Step coverage (\%)} = (\text{Thin Film Thickness of Lower End of Node}/\text{Thin Film Thickness of Upper End of Node}) \times 100 \quad (1)$$

TABLE 1

|  | ALD NbN | M-ALD NbN |
| --- | --- | --- |
| Step coverage (%) | 42 | 77 |

Table 1 illustrates step coverage data measured from an Example of a metal thin film formed according to of the inventive concept (M-ALD NbN) and from a Comparative Example of a metal thin film (ALD NbN). As shown in Table 1, since the metal thin film manufactured by the method of forming a metal thin film according to the inventive concept (M-ALD NbN) has excellent step coverage compared to the metal thin film manufactured by the method of a Comparative Example of a metal thin film (ALD NbN). Therefore, the thicknesses of the upper and lower ends of the node of the metal thin film manufactured by the method of forming a metal thin film according to the inventive concept (M-ALD NbN) are substantially similar.

As with the previously described experiments, the Example of a metal thin film formed according to of the inventive concept was an NbN metal thin film formed on a ZrO$_2$ dielectric film using the same process shown in FIG. 1 wherein reactant was supplied before the metal precursor containing chlorine was supplied, and the Comparative Example was an NbN metal thin film formed by a similar method but one in which the process began by supplying the metal precursor containing chlorine.

As the results show, the thicknesses of the upper and lower ends of the node are substantially the same in the Example of the metal thin film formed according to the inventive concept. Thus, the Example of the metal thin film formed according to the inventive concept has excellent step coverage.

According to an aspect of the inventive concept described above, in a metal thin film forming method, reactant or an adduct thereof is supplied before a metal precursor to prevent the product being coated with the metal thin film from being etched by the metal precursor. Therefore, a metal thin film can be formed that has excellent step coverage and allows for minimal leakage current.

Finally, embodiments of the inventive concept have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. An atomic layer deposition (ALD) method of forming a thin film on a surface of a product, the method comprising:
   loading the product into a processing chamber;
   supplying a gaseous adsorbate, comprising a reactant capable of reacting with a metal element-containing precursor of the thin film, into the processing chamber;
   after an amount of the adsorbate has been adsorbed at the surface of the product, supplying the precursor of the thin film into the processing chamber in an amount in excess of that which will react with the adsorbate at the surface of the product such that some of the precursor reacts with the adsorbate to form material of the thin film on the surface while another portion of the precursor is adsorbed and remains non-reacted at the surface of the product;
   subsequently performing a purging process by introducing a purge gas into the processing chamber;
   subsequently creating a reaction using the non-reacted precursor adsorbed at the surface of the product by supplying more of the reactant into the processing chamber, wherein the reaction forms a film comprising an element, selected from the group consisting of metals, on the surface of the product; and
   subsequently performing another purging process by introducing a purge gas into the processing chamber.

2. The method of claim 1, wherein the product is a substrate having a dielectric film thereon, and
   the precursor is a compound comprising M$_a$Cl$_b$, wherein M represents a metal, and reference characters a and b are integers each equal to a value of at least 1.

3. The method of claim 1, wherein the gaseous adsorbate consists of the reactant,
   a mono-layer of the adsorbed reactant is formed at the surface of the product before any of the precursor is introduced into the processing chamber, and
   the supplying of the gaseous metal precursor of the thin film into the processing chamber comprises supplying an amount of the precursor in excess of that which will react with the mono-layer of the reactant at the surface of the product.

4. An atomic layer deposition (ALD) method of forming a thin film on a surface of a product, the method comprising:
   loading the product into a processing chamber;
   supplying a gaseous adsorbate, comprising a reactant capable of reacting with a metal element-containing precursor of the thin film, into the processing chamber, and
   wherein the supplying of the gaseous adsorbate into the processing chamber comprises simultaneously supplying amounts of the reactant and precursor into the processing chamber in such a manner that an adduct of the reactant and precursor is adsorbed at the surface of the product;
   after an amount of the adduct has been adsorbed at the surface of the product, supplying the precursor of the thin film in gaseous form into the processing chamber in an amount in excess of that which will react with the adduct at the surface of the product such that some of the precursor reacts with the adduct to form material of the thin film on the surface while another portion of the precursor is adsorbed and remains non-reacted at the surface of the product;
   subsequently performing a purging process by introducing a purge gas into the processing chamber;

subsequently creating a reaction using the non-reacted precursor adsorbed at the surface of the product by supplying more of the reactant into the processing chamber, wherein the reaction forms a film comprising an element, selected from the group consisting of metals, on the surface of the product; and subsequently performing another purging process by introducing a purge as into the processing chamber.

5. The method of claim 4, further comprising after the adduct has been adsorbed at the surface of the product and before the gaseous precursor of the thin film is supplied into the processing chamber in such an amount that some of the precursor is adsorbed and remains non-reacted at the surface of the product, supplying an amount of the reactant into the processing chamber without supplying any of the precursor into the processing chamber.

6. The method of claim 1, wherein the supplying of gaseous adsorbate into the processing chamber comprises supplying an adduct of the reactant and precursor directly into the processing chamber such that the adduct is adsorbed at the surface of the product.

7. A method of forming a thin film on a product, the method comprising:
supplying the product with a precursor that includes a metal and chlorine;
subsequently performing a purging process by injecting a purge gas into the ambient around the product;
supplying the product with a reactant that reacts with the metal precursor to form a film comprising an element, selected from the group consisting of metals, on a surface of the product;
subsequently performing another purging process by injecting a purge gas into the ambient around the product on which the film has been formed; and
wherein before the supplying of the precursor the method further comprises forming an adduct of the precursor and the reactant as an adsorbate at a surface of the product.

8. The method of claim 7, wherein the forming of the adduct comprises simultaneously supplying the product with the reactant and the precursor.

9. The method of claim 7, wherein the forming of the adduct comprises supplying the product with the reactant and the precursor already combined as the adduct.

10. The method of claim 7, wherein the precursor is a compound including at least one metal selected from the group consisting of aluminum (Al), silicon (Si), titanium (Ti), cobalt (Co), gallium (Ga), germanium (Ge), strontium (Sr), yttrium (Y), zirconium (Zr), niobium (Nb), rhtenium (Ru), indium (In), barium (Ba), lanthanium (La), hafnium (Hf), tantalum (Ta), tungsten (W), iridium (Ir), lead (Pb), and bismuth (Bi).

11. The method of claim 7, wherein the adduct is $NbCl_5.NH_3$.

12. The method of claim 7, wherein the precursor is a compound including niobium (Nb), and the reactant comprises nitrogen.

13. The method of claim 12, wherein the product is a substrate having a dielectric film thereon, such that a film of NbN is formed on the dielectric film.

14. The method of claim 7, wherein the precursor is $NbCl_5$, and the reactant is $NH_3$, such that a film of NbN is formed on the surface of the product when the precursor is supplied.

15. The method of claim 7, further comprising performing a purging process by injecting a purge gas into the ambient around the product, after the adduct has been formed at the surface of the product and before the supplying of the precursor.

* * * * *